(12) United States Patent
Ko et al.

(10) Patent No.: US 8,455,860 B2
(45) Date of Patent: Jun. 4, 2013

(54) REDUCING SOURCE/DRAIN RESISTANCE OF III-V BASED TRANSISTORS

(75) Inventors: Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 489 days.

(21) Appl. No.: 12/616,073

(22) Filed: Nov. 10, 2009

(65) Prior Publication Data

US 2010/0276668 A1 Nov. 4, 2010

Related U.S. Application Data

(60) Provisional application No. 61/174,358, filed on Apr. 30, 2009.

(51) Int. Cl.
*H01L 29/12* (2006.01)
(52) U.S. Cl.
USPC 257/24; 257/192; 257/E29.069; 257/E29.089
(58) Field of Classification Search
USPC .................. 257/24, 192, E29.069, E29.089
See application file for complete search history.

(56) References Cited

U.S. PATENT DOCUMENTS

| | | | |
|---|---|---|---|
| 5,621,227 A | 4/1997 | Joshi | |
| 6,121,153 A * | 9/2000 | Kikkawa | 438/706 |
| 6,218,685 B1 | 4/2001 | Nogome | |
| 6,399,970 B2 | 6/2002 | Kubo et al. | |
| 6,475,869 B1 | 11/2002 | Yu | |
| 6,475,890 B1 | 11/2002 | Yu | |
| 6,512,252 B1 | 1/2003 | Takagi et al. | |
| 6,635,909 B2 | 10/2003 | Clark et al. | |
| 6,706,571 B1 | 3/2004 | Yu et al. | |
| 6,762,483 B1 | 7/2004 | Krivokapic et al. | |
| 6,858,478 B2 | 2/2005 | Chau et al. | |
| 6,960,781 B2 | 11/2005 | Currie et al. | |
| 7,045,401 B2 | 5/2006 | Lee et al. | |
| 7,190,050 B2 | 3/2007 | King et al. | |

(Continued)

FOREIGN PATENT DOCUMENTS

| AU | 2003 223306 A1 | 10/2003 |
|---|---|---|
| CN | 1289149 A | 3/2001 |

(Continued)

OTHER PUBLICATIONS

Chuang, R.W., et al., "Gallium nitride metal-semiconductor-metal photodetectors prepared on silicon substrates," Journal of Applied Physics, vol. 102, 2007, pp. 073110-1-073110-4.

(Continued)

*Primary Examiner* — Zandra Smith
*Assistant Examiner* — Paul Patton
(74) *Attorney, Agent, or Firm* — Slater & Matsil, L.L.P.

(57) ABSTRACT

An integrated circuit structure includes a substrate; a channel layer over the substrate, wherein the channel layer is formed of a first III-V compound semiconductor material; a highly doped semiconductor layer over the channel layer; a gate dielectric penetrating through and contacting a sidewall of the highly doped semiconductor layer; and a gate electrode on a bottom portion of the gate dielectric. The gate dielectric includes a sidewall portion on a sidewall of the gate electrode.

20 Claims, 5 Drawing Sheets

U.S. PATENT DOCUMENTS

| | | | |
|---|---|---|---|
| 7,205,615 | B2 | 4/2007 | Tsutsui et al. |
| 7,247,887 | B2 | 7/2007 | King et al. |
| 7,265,008 | B2 | 9/2007 | King et al. |
| 7,382,021 | B2 | 6/2008 | Faulkner et al. |
| 7,508,031 | B2 | 3/2009 | Liu et al. |
| 7,528,465 | B2 | 5/2009 | King et al. |
| 7,598,134 | B2 | 10/2009 | Mouli |
| 7,605,449 | B2 | 10/2009 | Liu et al. |
| 7,936,040 | B2 | 5/2011 | Wu |
| 7,956,383 | B2 | 6/2011 | Kuroda et al. |
| 8,058,692 | B2 | 11/2011 | Lai et al. |
| 8,174,073 | B2 | 5/2012 | Lee et al. |
| 2005/0104137 | A1 | 5/2005 | Faulkner et al. |
| 2005/0153490 | A1 | 7/2005 | Yoon et al. |
| 2005/0186742 | A1 | 8/2005 | Oh et al. |
| 2006/0057856 | A1 | 3/2006 | Senda et al. |
| 2006/0076625 | A1 | 4/2006 | Lee et al. |
| 2006/0148182 | A1 | 7/2006 | Datta et al. |
| 2006/0292719 | A1 | 12/2006 | Lochtefeld et al. |
| 2007/0102763 | A1 | 5/2007 | Yeo et al. |
| 2007/0120156 | A1 | 5/2007 | Liu et al. |
| 2007/0122953 | A1 | 5/2007 | Liu et al. |
| 2007/0122954 | A1 | 5/2007 | Liu et al. |
| 2007/0128782 | A1 | 6/2007 | Liu et al. |
| 2007/0132053 | A1 | 6/2007 | King et al. |
| 2007/0238281 | A1 | 10/2007 | Hudait et al. |
| 2007/0243703 | A1 | 10/2007 | Pinnington et al. |
| 2008/0169485 | A1 | 7/2008 | Heyns et al. |
| 2008/0237655 | A1 | 10/2008 | Nakabayashi et al. |
| 2008/0290470 | A1 | 11/2008 | King et al. |
| 2008/0296632 | A1 | 12/2008 | Moroz et al. |
| 2008/0315310 | A1 | 12/2008 | Rachmady et al. |
| 2009/0001415 | A1 | 1/2009 | Lindert et al. |
| 2009/0079014 | A1 | 3/2009 | Sandford et al. |
| 2009/0095984 | A1 | 4/2009 | Brask et al. |
| 2009/0181477 | A1 | 7/2009 | King et al. |
| 2009/0272965 | A1* | 11/2009 | Rachmady et al. ............ 257/24 |
| 2010/0102298 | A1 | 4/2010 | Wu |
| 2010/0252816 | A1 | 10/2010 | Ko et al. |
| 2010/0252862 | A1 | 10/2010 | Ko et al. |
| 2010/0301390 | A1 | 12/2010 | Ko et al. |
| 2010/0301392 | A1 | 12/2010 | Ko et al. |
| 2012/0001239 | A1 | 1/2012 | Ko et al. |

FOREIGN PATENT DOCUMENTS

| | | |
|---|---|---|
| CN | 1574399 A | 2/2005 |
| EP | 0921575 A2 | 6/1999 |
| EP | 1488462 B1 | 2/2011 |
| JP | 2005 019970 A | 1/2005 |
| JP | 2005005646 A | 1/2005 |
| JP | 2005-051241 A | 2/2005 |
| JP | 2005 062219 A | 3/2005 |
| JP | 2005 521258 A | 7/2005 |
| JP | 2006 516820 A | 7/2006 |
| JP | 2006 521026 A | 9/2006 |
| JP | 2008 508725 A | 3/2008 |
| JP | 2008-141040 A | 6/2008 |
| JP | 2008-160131 A | 7/2008 |
| JP | 2008-270521 A | 11/2008 |
| JP | 2008 546181 A | 12/2008 |
| JP | 2009-105163 A | 5/2009 |
| KR | 1020047012876 | 11/2004 |
| KR | 2007-0088817 A | 8/2007 |
| TW | 580771 B | 3/2004 |
| WO | WO 03081640 A2 | 10/2003 |
| WO | WO 2007 046150 A1 | 4/2007 |

OTHER PUBLICATIONS

Chui, C.O., et al., "Germanium $n$-type shallow junction activation dependences," Applied Physics Letters, vol. 87, 2005, pp. 091909-1-091909-3.

Datta, S., et al., "Ultrahigh-Speed 0.5 V Supply Voltage $In_{0.7}Ga_{0.3}As$ Quantum-Well Transistors on Silicon Substrate," IEEE Electron Device Letters, vol. 28, No. 8, Aug. 2007, pp. 685-687.

Iwakami, S., et al., "AlGaN/GaN Heterostructure Field-Effect Transistors (HFETs) on Si Substrates for Large-Current Operation," Japanese Journal of Applied Physics, vol. 43, No. 7A, 2004, pp. L831-L833.

Jackson, S.L., et al., "Silicon Doping of InP, GaAs, $In_{0.53}Ga_{0.47}As$ and $In_{0.49}Ga_{0.51}P$ Grown by Gas Source and Metalorganic Molecular Beam Epitaxy Using a $SiBr_4$ Vapor Source," IEEE, Conference Proceedings, Sixth International Conference on Indium Phosphide and Related Materials, Mar. 27-31, 1994, pp. 57-60.

Krishnamohan, T., et al., "High-Mobility Low Band-To-Band-Tunneling Strained-Germanium Double-Gate Heterostructure FETs: Simulations," IEEE Transactions on Electron Devices, vol. 53, No. 5, May 2006, pp. 1000-1009.

Posselt, M., et al., "P implantation into preamorphized germanium and subsequent annealing: Solid phase epitaxial regrowth, P diffusion, and activation," Journal of Vacuum Science Technology, vol. 26, Jan./Feb. 2008, pp. 430-434.

Satta, A., et al., "Diffusion, activation, and regrowth behavior of high dose P implants in Ge," Applied Physics Letters, vol. 88, 2006, pp. 162118-1-162118-3.

Satta, A., et al., "P implantation doping of Ge: Diffusion, activation, and recrystallization," Journal of Vacuum Science Technology, vol. 24, Jan./Feb. 2006, pp. 494-498.

Shih, C.-F., et al., "Blue, Green, and White InGaN Light-Emitting Diodes Grown on Si," Japanese Journal of Applied Physics, vol. 44, No. 4, 2005, pp. L140-L143.

Vanamu, G., et al., "Growth of high-quality GaAs on $Ge/Si_{1-x}Ge_x$ on nanostructured silicon substrates," Applied Physics Letters, vol. 88, 2006, pp. 251909-1-251909-3.

Vurgaftman, I., et al., "Band perameters for III-V compound semiconductors and their alloys," Journal of Applied Physics, vol. 89, No. 11, Jun. 1, 2001, pp. 5815-5875.

Yamane, Y., et al., "Selective Formation of Ohmic Contacts to $n$-GaAs," IEEE, Electronics Letters, vol 23, No. 8, Apr. 9, 1987, pp. 382-383.

* cited by examiner

US 8,455,860 B2

REDUCING SOURCE/DRAIN RESISTANCE OF III-V BASED TRANSISTORS

This application claims the benefit of U.S. Provisional Application No. 61/174,358 filed on Apr. 30, 2009, entitled "Reducing Source/Drain Resistance of III-V Based Transistors," which application is hereby incorporated herein by reference.

TECHNICAL FIELD

This invention relates generally to integrated circuit structures, and more particularly to transistors comprising III-V compound semiconductors and methods for forming the same.

BACKGROUND

The speeds of metal-oxide-semiconductor (MOS) transistors are closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (commonly known as III-V compound semiconductors) are good candidates for forming NMOS transistors due to their high electron mobility. Therefore, III-V compound semiconductors have been commonly used to form NMOS transistors. To reduce the manufacturing cost, methods for forming PMOS transistors using III-V compound semiconductors have also been explored. FIG. 1 illustrates a conventional transistor incorporating III-V compound semiconductors. In the formation process, a plurality of layers is blanket formed on a silicon substrate, wherein the plurality of layers includes a buffer layer formed of GaAs, a graded buffer layer formed of $In_xAl_{1-x}As$ (with x between, but not equal to, 0 and 1), a bottom barrier layer formed of $In_{0.52}Al_{0.48}As$, a channel layer formed of $In_{0.7}Ga_{0.3}As$, a top barrier layer formed of $In_{0.52}Al_{0.48}As$, an etch stop layer formed of InP, and a contact layer formed of $In_{0.53}Ga_{0.47}As$. A first etch is performed to etch through the contact layer ($In_{0.53}Ga_{0.47}As$) and stop at the etch stop layer (InP) to form a first recess. A second etch is then performed to etch through the etch stop layer (InP) and into a portion of the top barrier layer ($In_{0.52}Al_{0.48}As$) to form a second recess. A gate, which is formed of metal, is then formed in the second recess. The resulting transistor has the advantageous feature of a quantum well formed of the bottom barrier layer, the channel layer, and the top barrier layer.

The above-described structure and process steps, however, suffer from drawbacks. The contact layers ($In_{0.53}Ga_{0.47}As$) are horizontally spaced apart from the gate by distance S. Further, the etch stop layer (InP) has a relatively wide bandgap and has a high resistivity. Therefore, there exists a high resistance path between the metal source/drain and the channel layer. Therefore, the external resistance of the source and drain regions is high, which adversely affects the drive current of the transistor. A method and a structure for overcoming the above-described shortcomings in the prior art are thus needed.

SUMMARY OF THE INVENTION

In accordance with one aspect of the present invention, an integrated circuit structure includes a substrate; a channel layer over the substrate, wherein the channel layer is formed of a first III-V compound semiconductor material; a highly doped semiconductor layer over the channel layer; a gate dielectric penetrating through and contacting a sidewall of the highly doped semiconductor layer; and a gate electrode on a bottom portion of the gate dielectric. The gate dielectric includes a sidewall portion on a sidewall of the gate electrode.

Other embodiments are also disclosed.

The advantageous features of the present invention include reduced source and drain resistances and an increased drive current in the resulting transistor.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Novel transistors comprising compound semiconductor materials of group III and group V elements (referred to as III-V compound semiconductors hereinafter) and the methods of forming the same are provided. The intermediate stages in the manufacturing of embodiments of the present invention are illustrated. The variations of the embodiments are discussed. Throughout the various views and illustrative embodiments of the present invention, like reference numbers are used to designate like elements.

Figure 1:
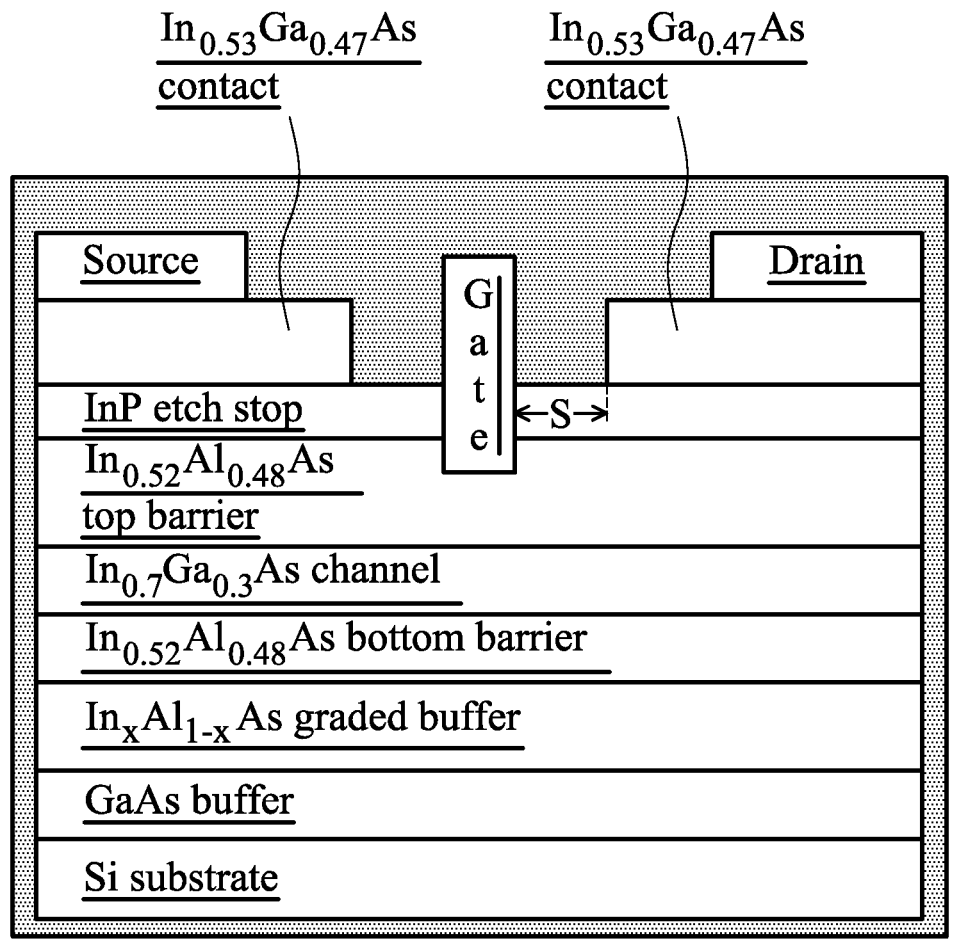
FIG. 1 illustrates a conventional transistor comprising III-V compound semiconductor materials of group III and group V elements.
Figure 2:
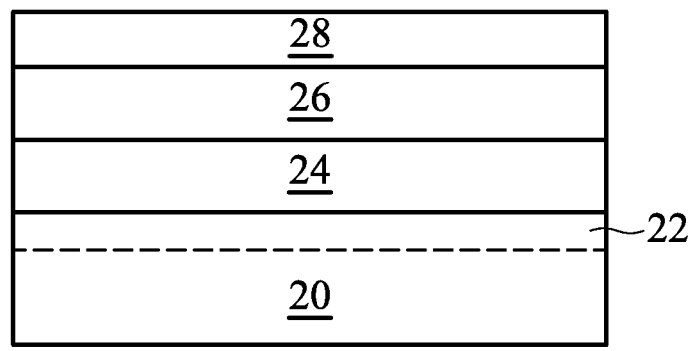
FIGS. 2 through 8 are cross-sectional views of intermediate stages in the manufacturing of a transistor in accordance with an embodiment.

Referring to FIG. 2, substrate 20 is provided. Substrate 20 may be a semiconductor substrate formed of silicon, germanium, SiGe, InP, and/or other semiconductor materials. A plurality of layers, which may be formed of compound semiconductor materials, is epitaxially grown on substrate 20. In an embodiment, the plurality of layers includes bottom barrier layer 24, channel layer 26, and top barrier layer 28. In an embodiment, channel layer 26 has a first bandgap, while bottom barrier layer 24 and top barrier layer 28 have a second bandgap greater than the first bandgap. Accordingly, layers 24, 26, and 28 form a quantum well. In an exemplary embodiment, the second bandgap is greater than the first bandgap by about 0.1 eV, although greater or lower bandgap differences may also apply. The appropriate materials of channel layer 26, top barrier layer 28 and bottom barrier layer 24 may be selected by comparing the bandgaps of the available semiconductor materials with high carrier mobilities, which materials may include, but are not limited to, silicon, germanium, GaAs, InP, GaN, InGaAs, InAs, InSb, InAlAs, GaSb, AlSb, AlAs, AlP, GaP, and combinations thereof. In an exemplary embodiment, channel layer 26 comprises $In_{0.7}Ga_{0.3}As$, while bottom barrier layer 24 and top barrier layer 28 comprise $In_{0.52}Al_{0.48}As$. In other embodiments, channel layer 26 is formed of InGaAs, while bottom barrier layer 24 and top barrier layer 28 are formed of GaAs. In yet other embodiments, channel layer 26 is formed of InAs, while bottom barrier layer 24 and top barrier layer 28 comprise InAlAs.

Bottom barrier layer 24 may have a thickness between about 5 nm and about 10 µm, channel layer 26 may have a thickness between about 2 nm and about 50 nm, and top barrier layer 28 may have a thickness between about 5 nm and about 500 nm. It is realized, however, that the dimensions recited throughout the description are merely examples, and may be changed if different formation technologies are used.

Optionally, additional buffer layer(s) such as buffer layer 22 may be formed on top of substrate 20. Buffer layer 22 may have a lattice constant between the lattice constant of substrate 20 and the lattice constant of the overlying layer such as bottom barrier layer 24, so that the transition of lattice constants from lower layers to upper layers is less abrupt.

Figure 3:
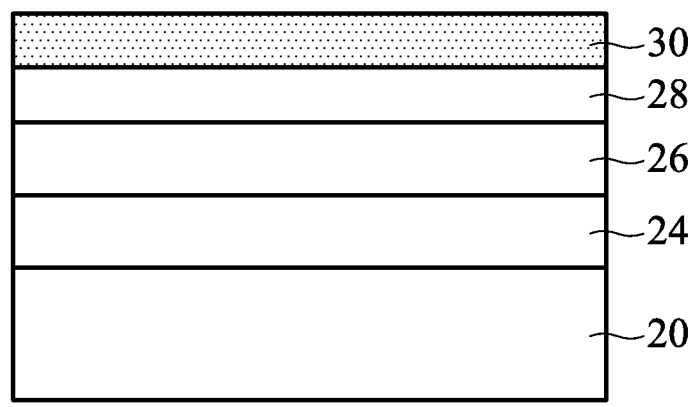

FIG. 3 illustrates the formation of highly doped layer 30 on top barrier layer 28. Highly doped layer 30 is formed of a semiconductor material, and may be in-situ doped to a high impurity concentration, for example, greater than about $1 \times 10^{18}/cm^3$, although a lower concentration can also be used. The impurity concentration in highly doped layer 30 may also be greater than the impurity concentrations in any of top barrier layer 28, channel layer 26, and bottom barrier layer 24. It is preferable to dope highly doped layer 30 using in-situ doping instead of implanting, so that the impurity introduced by the step of doping the highly doped layer 30 is not substantially introduced into top barrier layer 28. The element of the doped impurity is partially determined by the semiconductor material of the highly doped layer 30. In an embodiment, highly doped layer 30 comprises silicon, germanium, carbon, and/or combinations thereof. Accordingly, if the resulting transistor is an NMOS transistor, common n-type impurities such as phosphorous, arsenic, and combinations thereof may be used. Conversely, if the resulting transistor is a PMOS transistor, the doped impurity may include boron. In other embodiments, highly doped layer 30 comprises III-V compound semiconductor materials such GaAs, InGaAs, InAs, InSb, GaSb, GaN, InP, and combinations thereof. Accordingly, if the resulting transistor is an NMOS transistor, the doped impurity may include silicon (Si). Conversely, if the resulting transistor is a PMOS transistor, the doped impurity may include zinc (Zn) and/or beryllium (Be). Highly doped layer 30 may also have a bandgap smaller than that of top barrier layer 28. As a result of the small bandgap and the high doping concentration, the resistivity of highly doped layer 30 is low. The formation methods of highly doped layer 30 include metal organic chemical vapor deposition (MOCVD), although other commonly used deposition methods can also be used.

Figure 4:
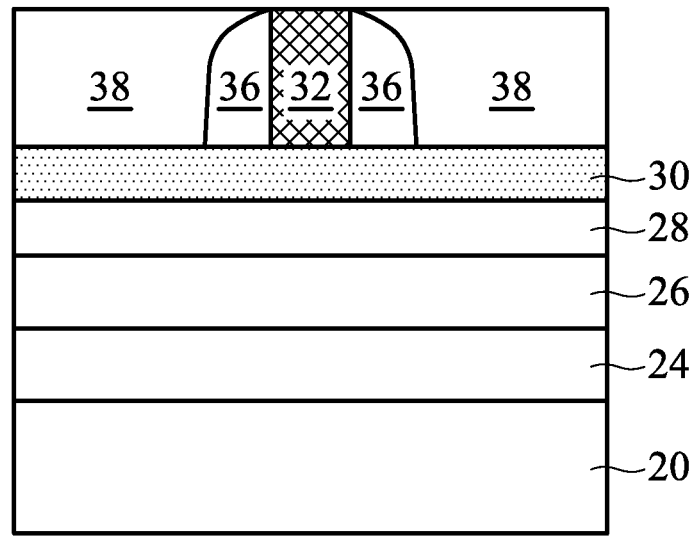

Next, a gate-last approach is taken to form a gate structure, as is shown in FIGS. 4 through 7. FIG. 4 illustrates the formation of dummy gate 32, gate spacers 36, and sacrificial inter-layer dielectric (ILD) 38. Dummy gate 32 may be formed of polysilicon or other materials having a high etching selectivity relative to gate spacers 36 and highly doped layer 30. Optionally, a dummy gate dielectric (not shown) may be formed between dummy gate 32 and highly doped layer 30. Gate spacers 36 may be formed of dielectric materials such as silicon oxide, silicon nitride, and composite layers thereof. The formation processes of dummy gate 32 and gate spacers 36 are known in the art, and hence are not described in detail herein.

Sacrificial ILD 38 is then formed to a level higher than the top edge of gate spacers 36. A planarization, for example, a chemical mechanical polish (CMP), is then performed. The planarization may stop at the top edge of gate spacers 36. As a result, dummy gate 32 is exposed, while highly doped layer 30 is covered.

Figure 5:
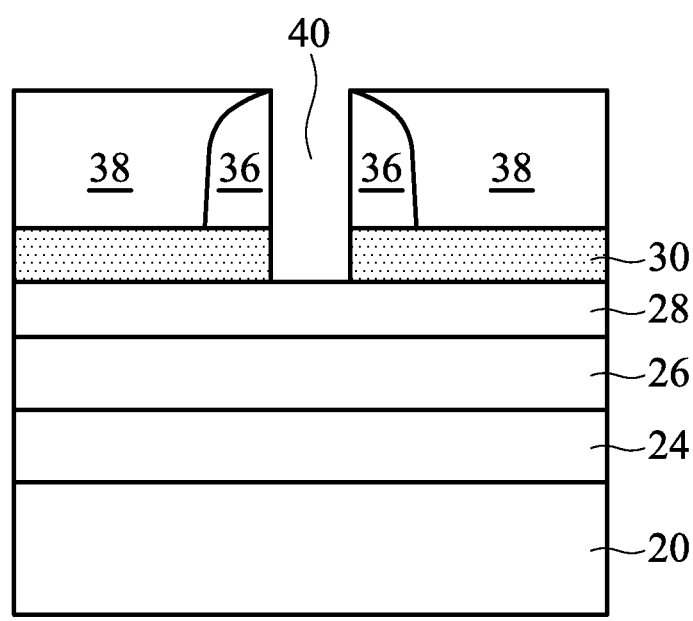

Referring to FIG. 5, dummy gate 32 (and the dummy gate dielectric, if any) is removed by etching, leaving opening 40, and hence the underlying highly doped layer 30 is exposed.

Next, an additional etch is performed to remove the exposed portion of highly doped layer 30, with the etch stopping at top barrier layer 28. The etchant may be selected so that there is a high etching selectivity between highly doped layer 30 and top barrier layer 28, and top barrier layer 28 is etched as little as possible.

Figure 6:
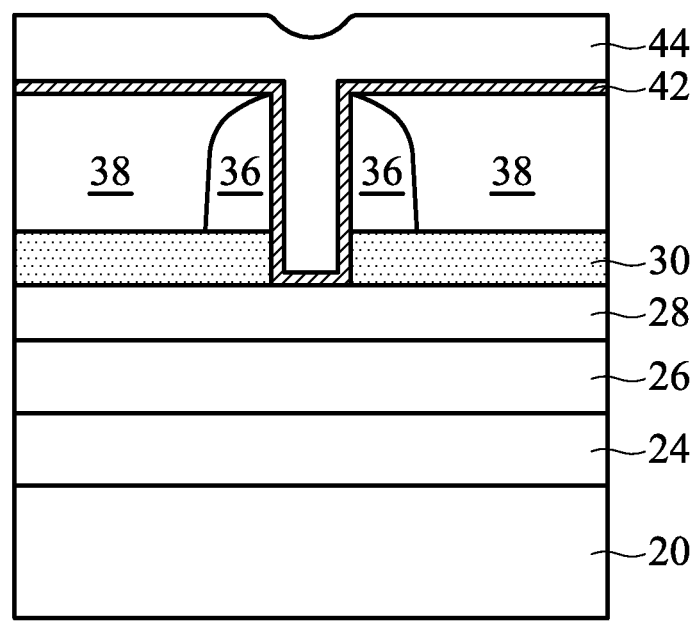

Referring to FIG. 6, gate dielectric layer 42 and gate electrode layer 44 are formed to fill opening 40. Gate dielectric layer 42 may be formed of commonly used dielectric materials such as silicon oxide, silicon nitride, oxynitrides, multi-layers thereof, and combinations thereof. Gate dielectric layer 42 may also be formed of high-k dielectric materials. The exemplary high-k materials may have k values greater than about 4.0, or even greater than about 7.0, and may include aluminum oxide, hafnium oxide, hafnium oxynitride, hafnium silicate, zirconium silicate, yttrium oxide, cerium oxide, titanium oxide, tantalum oxide, and combinations thereof. Gate electrode layer 44 may be formed of metals such as TaN, TiN, Pd, Pt, Al, Au, Ni, Ti, Er, W and combinations thereof, metal nitrides, metal silicides, doped polysilicon, and the like.

Figure 7:
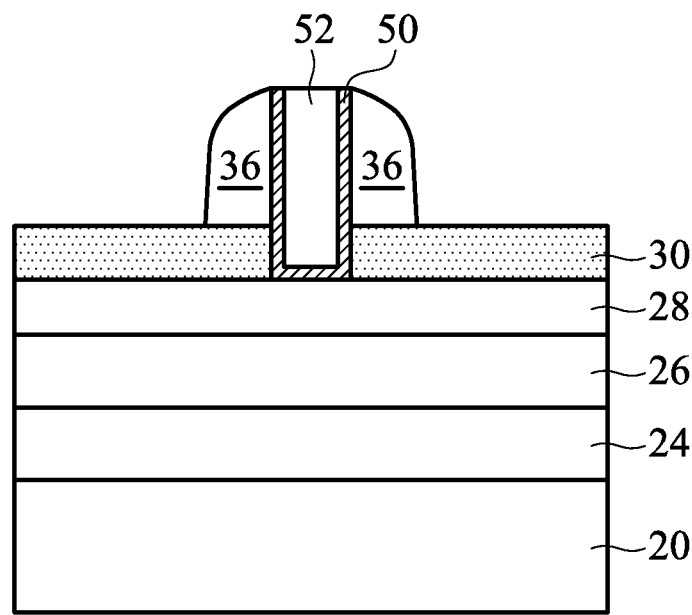

A CMP is then performed to remove portions of gate dielectric layer 42 and gate electrode layer 44 outside opening 40 (refer to FIG. 5). In the resulting structure, a gate structure including gate dielectric 50 and gate electrode 52 is left, as is shown in FIG. 7. Sacrificial ILD 38 is then removed, so that highly doped layer 30 is exposed. It is noted that gate dielectric 50 has a bottom portion contacting top barrier layer 28 and has sidewall portions on the sidewalls of gate electrode 52. The sidewall portions of gate dielectric 50 further separate gate electrode 52 from gate spacers 36.

Figure 8:
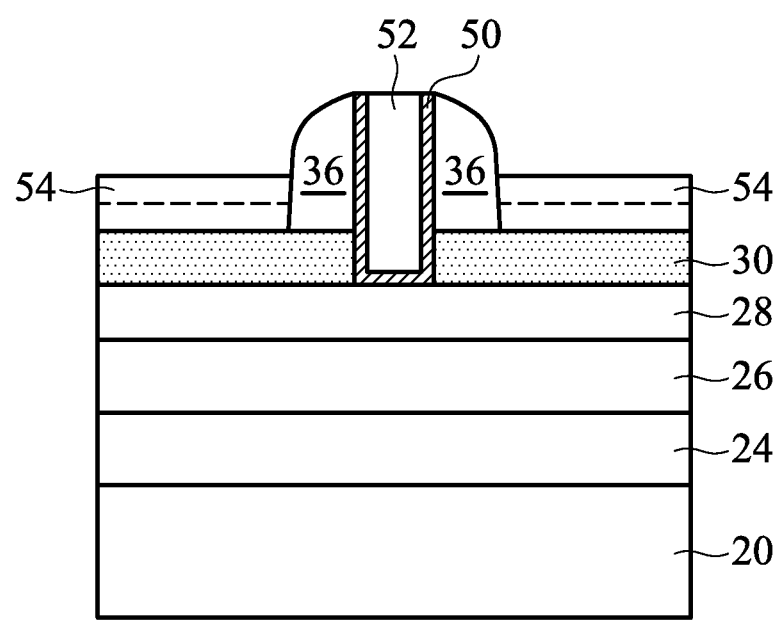

Next, as shown in FIG. 8, metal layer 54 is formed over highly doped layer 30, wherein metal layer 54 may include nickel, aluminum, palladium, gold, and/or the like. Additional anneal processes may be performed so that metal layer 54 reacts with the underlying semiconductor layer, which may be highly doped layer 30 or an additional contact layer (not shown), to reduce the contact resistance. Throughout the description, metal layer 54 and the underlying highly doped layer 30 are referred to as source and drain regions due to their relatively low resistivities.

Optionally, additional contact layer(s) may be formed between metal layer 54 and highly doped layer 30, and may be formed of semiconductor materials such as silicon, germanium, GaAs, InGaAs, InAs, InSb, GaSb, GaN, InP, and combinations thereof. The additional layer(s) may generally be allocated with the trend that the upper layers have higher doping concentrations and/or lower bandgaps, while the lower layers have lower doping concentrations and/or higher bandgaps. Accordingly, the additional contact layer(s) may have higher doping concentrations and/or lower bandgaps than highly doped layer 30. The elements of the doped impurities in the additional contact layer(s) may also be determined based on the materials of the additional contact layer(s), similar to the relationship between highly doped layer 30 and the impurities therein. In alternative embodiments, the additional contact layer(s) and metal layer 54 may be formed after the formation of gate spacers 36 and before the removal of dummy gate 32. Accordingly, sacrificial ILD 38 no longer needs to be removed, and an additional ILD may be formed on sacrificial ILD 38.

The embodiments of the present invention have several advantageous features. By forming the highly doped layer first and then adopting a gate-last approach to form a gate structure extending into the highly doped layer, a highly doped layer having a low resistance is close to the gate structure. Further, the highly doped layer is formed directly on the top barrier layer and hence there is no additional high resistance etch stop layer therebetween. Therefore, the source/drain resistance is small, and the drive current of the resulting transistor is high.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a substrate;
   a channel layer over the substrate, wherein the channel layer is formed of a first III-V compound semiconductor material comprising group III and group V elements;
   a highly doped semiconductor layer over the channel layer, wherein the highly doped semiconductor layer is selected from the group consisting essentially of silicon, germanium, carbon, and combinations thereof;
   a gate dielectric penetrating through and contacting a sidewall of the highly doped semiconductor layer; and
   a gate electrode on a bottom portion of the gate dielectric, wherein the gate dielectric comprises a sidewall portion on a sidewall of the gate electrode.

2. The integrated circuit structure of claim 1 further comprising a gate spacer comprising a bottom contacting a first portion of a top surface of the highly doped semiconductor layer, and a sidewall contacting the sidewall portion of the gate dielectric.

3. The integrated circuit structure of claim 2, wherein the top surface of the highly doped semiconductor layer comprises a second portion not in contact with the bottom of the gate spacer, and wherein the first portion is level with the second portion.

4. The integrated circuit structure of claim 1, wherein a bottom surface of the bottom portion of the gate dielectric is substantially level with a bottom surface of the highly doped semiconductor layer.

5. The integrated circuit structure of claim 1, wherein the highly doped semiconductor layer is doped with an impurity selected from the group consisting essentially of a p-type impurity and an n-type impurity.

6. The integrated circuit structure of claim 5, wherein the impurity has a concentration greater than about $1 \times 10^{18}/cm^3$.

7. The integrated circuit structure of claim 1, wherein the highly doped semiconductor layer comprises a second III-V compound semiconductor material, and wherein the highly doped semiconductor layer is doped with an impurity selected from the group consisting essentially of Si, Zn, Be, and combinations thereof.

8. The integrated circuit structure of claim 7, wherein the impurity has a concentration greater than about $1 \times 10^{18}/cm^3$.

9. The integrated circuit structure of claim 7, wherein the second III-V compound semiconductor material is selected from the group consisting essentially of GaAs, InGaAs, InAs, InSb, GaSb, GaN, InP, and combinations thereof.

10. The integrated circuit structure of claim 1 further comprising a metal layer over the highly doped semiconductor layer.

11. The integrated circuit structure of claim 1, wherein the channel layer is a portion of a quantum well.

12. The integrated circuit structure of claim 1, wherein the first III-V compound semiconductor material is selected from the group consisting essentially of GaAs, InGaAs, InAs, InSb, GaSb, GaN, InP, and combinations thereof.

13. An integrated circuit structure comprising:
    a substrate;
    a bottom barrier over the substrate;
    a channel layer over the bottom barrier and comprising a first compound semiconductor material formed of group III and group V elements;
    a top barrier over the channel layer, wherein bandgaps of the bottom barrier and the top barrier are greater than a bandgap of the channel layer;
    a highly doped semiconductor layer over and contacting the top barrier, wherein the highly doped semiconductor layer is doped with an impurity having a concentration greater than about $1 \times 10^{18}/cm^3$;
    a gate structure extending from over the highly doped semiconductor layer to inside the highly doped semiconductor layer, wherein the gate structure contacts the top barrier; and
    a gate spacer on a sidewall of the gate structure, wherein the highly doped semiconductor layer extends directly under the gate spacer.

14. The integrated circuit structure of claim 13, wherein the sidewall of the gate structure comprises a portion contacting a sidewall of the highly doped semiconductor layer.

15. The integrated circuit structure of claim 13, wherein the gate structure comprises:
    a gate dielectric comprising a bottom portion and a sidewall portion; and
    a gate electrode on the bottom portion of the gate dielectric, wherein the sidewall portion of the gate dielectric spaces the gate electrode apart from the gate spacer.

16. The integrated circuit structure of claim 13, wherein a bottom surface of the gate structure is substantially level with a bottom surface of the highly doped semiconductor layer.

17. The integrated circuit structure of claim 13, wherein the highly doped semiconductor layer comprises a semiconductor material selected from the group consisting essentially of silicon, germanium, carbon, and combinations thereof, and wherein the impurity is selected from the group consisting essentially of a p-type impurity and an n-type impurity.

18. The integrated circuit structure of claim 13, wherein the highly doped semiconductor layer comprises a III-V compound semiconductor material, and wherein the impurity is selected from the group consisting essentially of Si, Zn, and Be.

19. A method for forming an integrated circuit structure comprising:
    providing a substrate;
    forming a channel layer above the substrate, wherein the channel layer is formed of a first III-V compound semiconductor material comprising group III and group V elements;
    forming a top barrier over the channel layer, wherein a bandgap of the top barrier is greater than a bandgap of the channel layer;
    forming a highly doped semiconductor layer over and contacting the top barrier; and forming a gate structure extending from over the highly doped semiconductor layer to inside the highly doped semiconductor layer, wherein the gate structure contacts the top barrier.

20. The method of claim 19, wherein the highly doped semiconductor layer comprises a second III-V compound semiconductor material, and wherein the highly doped semiconductor layer is doped with an impurity selected from the group consisting essentially of Si, Zn, Be, and combinations thereof.

* * * * *